US008319276B2

(12) United States Patent
Nakanishi et al.

(10) Patent No.: US 8,319,276 B2
(45) Date of Patent: Nov. 27, 2012

(54) NON-VOLATILE SEMICONDUCTOR MEMORY DEVICES HAVING CHARGE TRAP LAYERS BETWEEN WORD LINES AND ACTIVE REGIONS THEREOF

(75) Inventors: Toshiro Nakanishi, Gyeonggi-do (KR); Chanjin Park, Gyeonggi-do (KR); Siyoung Choi, Gyeonggi-do (KR); Bonyoung Koo, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 282 days.

(21) Appl. No.: 12/712,366

(22) Filed: Feb. 25, 2010

(65) Prior Publication Data

US 2010/0252877 A1 Oct. 7, 2010

(30) Foreign Application Priority Data

Apr. 6, 2009 (KR) .................. 10-2009-0029588

(51) Int. Cl.
*H01L 29/792* (2006.01)
(52) U.S. Cl. .................. 257/324; 257/E29.309
(58) Field of Classification Search .......... 257/324, 257/E21.659, E21.414, E21.676, E21.614, 257/E29.309, E29.3, 315
See application file for complete search history.

(56) References Cited

U.S. PATENT DOCUMENTS

| | | | |
|---|---|---|---|
| 6,555,866 B1 * | 4/2003 | Kuo | 257/314 |
| 7,005,350 B2 * | 2/2006 | Walker et al. | 438/268 |
| 7,329,578 B2 * | 2/2008 | Wei | 438/257 |
| 7,560,764 B2 | 7/2009 | Park et al. | |
| 2006/0170034 A1 * | 8/2006 | Park et al. | 257/324 |
| 2006/0205124 A1 * | 9/2006 | Herner | 438/149 |
| 2006/0284245 A1 * | 12/2006 | Park et al. | 257/324 |
| 2007/0200168 A1 * | 8/2007 | Ozawa et al. | 257/324 |
| 2008/0290391 A1 * | 11/2008 | Hsu et al. | 257/315 |
| 2009/0057745 A1 * | 3/2009 | Yin et al. | 257/315 |
| 2010/0213536 A1 * | 8/2010 | Nakanishi et al. | 257/324 |
| 2010/0252877 A1 * | 10/2010 | Nakanishi et al. | 257/324 |

FOREIGN PATENT DOCUMENTS

| | | |
|---|---|---|
| JP | 2007-220914 | 8/2007 |
| JP | 2007-251132 | 9/2007 |
| KR | 1020080076234 A | 8/2008 |

* cited by examiner

*Primary Examiner* — Matthew Landau
*Assistant Examiner* — Latanya N Crawford
(74) *Attorney, Agent, or Firm* — Myers Bigel Sibley & Sajovec

(57) ABSTRACT

A non-volatile memory device includes: word line disposed on a substrate; an active region crossing over the word line; and a charge trap layer that is between the word line and the active region.

13 Claims, 7 Drawing Sheets

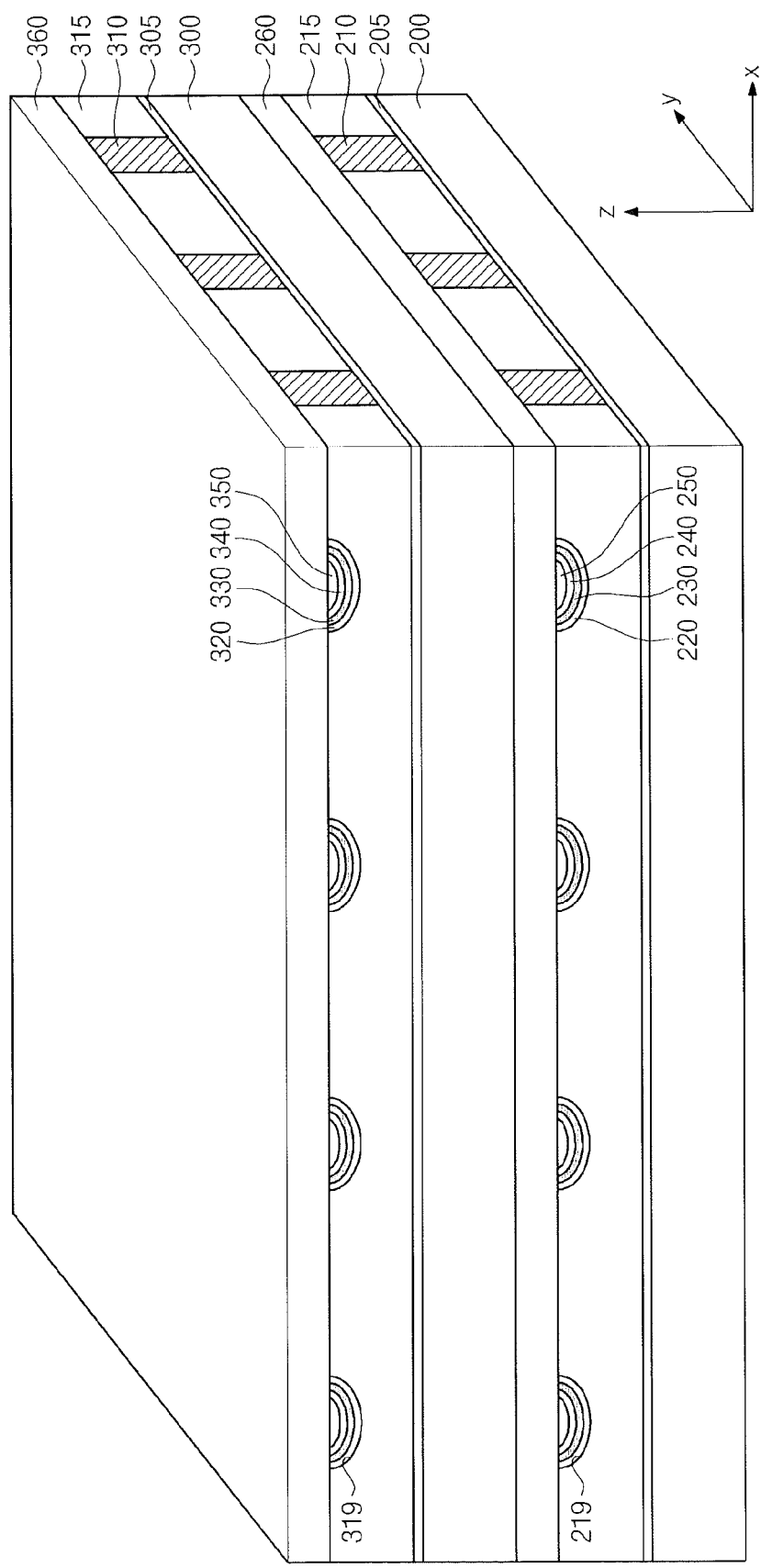

NON-VOLATILE SEMICONDUCTOR MEMORY DEVICES HAVING CHARGE TRAP LAYERS BETWEEN WORD LINES AND ACTIVE REGIONS THEREOF

CROSS-REFERENCE TO RELATED APPLICATION

This U.S. non-provisional patent application claims priority under 35 U.S.C. §119 to Korean Patent Application No. 10-2009-0029588, filed on Apr. 6, 2009, the entire contents of which are incorporated by reference herein as if set forth in its entirety.

BACKGROUND

The present disclosure herein relates to semiconductor memory devices and, more particularly, to non-volatile semiconductor memory devices.

Semiconductor memory devices may generally be classified as volatile or non-volatile memory devices. Volatile semiconductor memory devices lose stored data when a power supply to the memory device is interrupted. Non-volatile semiconductor memory devices can retain data even when the power supply to the device is interrupted. Flash memory devices are one well known type of non-volatile semiconductor memory that may be highly integrated and which may have the advantages of both an EPROM (Erasable Programmable Read Only Memory) device which is capable of programming and erasing data, and of an EEPROM (Electrically Erasable Programmable Read Only Memory) which is capable of electrically programming and erasing data.

A flash memory may have a floating gate and a control gate, which may be sequentially stacked. The floating gate is used for storing data and the control gate is used for controlling the data that is stored in the floating gate. The height of the floating gate, however, may act as an impediment to further scaling down the size of a highly integrated flash memory device. Consequently, flash memory devices that include charge trap layers have been developed to reduce the height of each memory cell therein.

SUMMARY

Embodiments of the present invention provide non-volatile semiconductor memory devices that may exhibit enhanced reliability and/or performance.

Pursuant to some embodiments of the present invention, non-volatile memory devices are provided that have a word line that is disposed on a substrate. An active region crosses over the word line. A charge trap layer is disposed between the word line and the active region.

In some embodiments, the word line includes a recess that has a reverse-arch shape. In such embodiments, the active region may be at least partly within the recess. An insulating layer may cover first and second sidewalls of the word line, and the recess may extend through the insulating layer. A bottom surface of the active region may have an arch shape.

In some embodiments, a dielectric layer may be disposed between the charge trap layer and the word line, and a tunnel insulating layer may be disposed between the active region and the charge trap layer. The dielectric layer and the tunnel insulating layer may have curved surfaces along the recess. In some embodiments, the tunnel insulating layer may comprise a silicon oxide layer, the charge trap layer may comprise a silicon nitride layer, and the dielectric layer may comprise a silicon oxide layer.

In some embodiments, the word line may comprise a mono-crystalline silicon layer, and the active region may comprise a polysilicon layer. The substrate may comprise a semiconductor substrate and a buried insulating layer on the semiconductor substrate. In such embodiments, the word line may be disposed on the buried insulating layer, and the semiconductor substrate, the buried insulating layer and the word line may together constitute a SOI (Silicon On Insulator) substrate.

In further embodiments, the word line may comprise a polysilicon layer and/or a metal layer, and the active region may comprise a polysilicon layer.

Pursuant to further embodiments of the present invention, non-volatile memory devices are provided that include a plurality of first word lines disposed on a substrate. A plurality of first active regions are provided that cross over the first word lines. First charge trap layers are disposed between the first word lines and the first active regions. An interlayer insulating layer is disposed on the first active regions. A plurality of second word lines are disposed on the interlayer insulating layer. A plurality of second active regions cross over the second word lines. Finally, second charge trap layers are disposed between the second word lines and second active regions.

In some embodiments, the first word lines have first recesses that have a reverse-arch shape, and the second word lines have second recesses that have a reverse-arch shape. In such embodiments, the first active regions may cross over the first recesses, and the second active regions may cross over the second recesses.

BRIEF DESCRIPTION OF THE DRAWINGS

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the figures:

FIG. 2 is a perspective view illustrating a non-volatile memory device according to another embodiment of the present invention;

DETAILED DESCRIPTION

Figure 1:
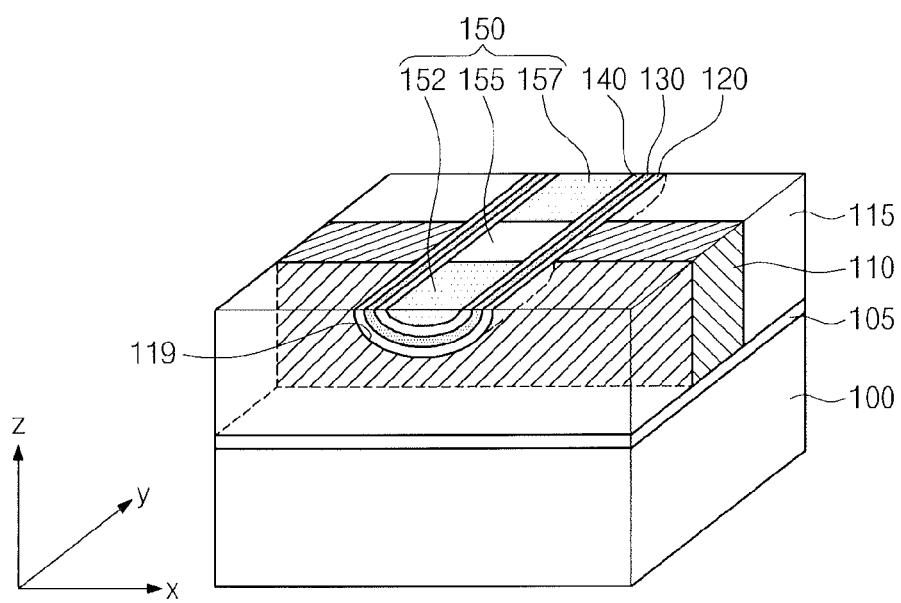
FIG. 1 is a perspective view illustrating a non-volatile memory device according to an embodiment of the present invention.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

It will be understood that, although the terms first, second, etc. may be used herein to describe various elements, these elements should not be limited by these terms. These terms are only used to distinguish one element from another. As used herein, the term "and/or" includes any and all combinations of one or more of the associated listed items.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Other words used to describe the relationship between elements should be interpreted in a like fashion (i.e., "between" versus "directly between", etc.).

Relative terms such as "below" or "above" or "upper" or "lower" or "horizontal" or "vertical" may be used herein to describe a relationship of one element, layer or region to another element, layer or region as illustrated in the figures. It will be understood that these terms are intended to encompass different orientations of the device in addition to the orientation depicted in the figures.

Embodiments of the invention are described herein with reference to illustrations that are schematic illustrations of idealized embodiments (and intermediate structures) of the invention. The thickness of layers and regions in the drawings may be exaggerated for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing.

The terminology used herein is for the purpose of describing particular embodiments only and is not intended to be limiting of the invention. It will be further understood that the terms "comprises" "comprising," "includes" and/or "including" when used herein, specify the presence of stated features, elements, and/or components, but do not preclude the presence or addition of one or more other features, elements, components, and/or groups thereof.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this disclosure and the relevant art and will not be interpreted in an idealized or overly formal sense unless expressly so defined herein.

FIG. 1 is a perspective view illustrating a non-volatile memory device according to an embodiment of the present invention.

Referring to FIG. 1, a first insulating layer 105 is disposed on a substrate 100. The first insulating layer 105 may include a material that has an insulating characteristic, such as, for example, a silicon oxide layer, a silicon nitride layer or a silicon oxy-nitride layer. A word line 110 is disposed on the first insulating layer 105. The word line 110 extends in a first direction. For example, the word line 110 extends in x-direction in FIG. 1. A second insulating layer 115 is disposed on the first insulating layer 105 to cover sidewalls of the word line 110.

An active region 150 crosses over the word line 100. The active region 150 extends in a second direction that crosses the first direction. For example, in the embodiment of FIG. 1, the second direction is the y-direction in FIG. 1. A charge trap layer 130 is disposed between the active region 150 and the word line 110. The charge trap layer 130 may have a charge trap site capable of trapping a charge.

The word line 110 has a recess 119. The active region 150 may be formed in the recess 119. In some embodiments, the active region 150 (along with other layers that are discussed below) may fill the recess 119. The recess 119 may have a curved surface. For example, in some embodiments the recess 119 may have a reverse-arch shape. The bottom surface of the active region 150 may have an arch shape. The second insulating layer 115 may also have a recess 119, and the active region 150 may likewise be formed in the recess 119 in the second insulating layer 115. Consequently, the active region 150 may extend in the second direction along with the recess 119.

A dielectric layer 120 is disposed between the charge trap layer 130 and the word line 110. The dielectric layer 120 may include, for example, a silicon oxide layer, an aluminum oxide layer, a lanthanum hafnium oxide layer, a lanthanum aluminum oxide layer and/or a dysprosium scandium oxide layer.

A tunnel insulating layer 140 is disposed between the charge trap layer 130 and the active region 150. The tunnel insulating layer 140 may be formed of at least one of various materials, such as silicon oxide, silicon oxynitride and hafnium oxide. The tunnel insulating layer 140 may be formed of silicon oxide. In this case, the tunnel insulating layer 140 may have thickness that direct tunneling is not arisen through the tunnel insulating layer 140. The charge trap layer 130 may include a silicon nitride layer.

The active region 150 may comprise part of a first memory cell. The word line 110 that crosses under the active region 150 may act as a control gate of the memory cell.

If the tunnel insulating layer 140, the charge trap layer 130 and the dielectric layer 120 form an oxide-nitride-oxide structure, the non-volatile memory device may be a SONOS (Silicon-Oxide-Nitride-Oxide-Silicon) device.

The word line 110 may comprise, for example, a mono-crystalline silicon layer, and the mono-crystalline silicon layer may be doped to have electrical conductivity. If the word line 110 is a mono-crystalline silicon layer, the word line 110 may comprise a silicon layer of a SOI (Silicon On Insulator) substrate. In general, the SOI substrate may include a semiconductor substrate, a buried insulating layer on the semiconductor substrate, and a silicon layer on the buried insulating layer. Thus, the semiconductor substrate of the SOI substrate may correspond to the substrate 100 shown in FIG. 1, the buried insulating layer of the SOI substrate may correspond to the first insulating layer 105, and the silicon layer of the SOI substrate may correspond to the word line 110. In other embodiments, the word line 110 may comprise a polysilicon layer or a metal layer.

The active region 150 may comprise a polysilicon layer. The active region 150 may include a channel region 155, a source electrode 152 and a drain electrode 157, each of which may include dopants. The channel region 155 may have different dopants from that of the source electrode 152 and the drain electrode 157.

A radius of curvature of the tunnel insulating layer 140 may be shorter than a radius of curvature of the dielectric layer 120. As a result, an electric field may be formed more strongly in the tunneling insulating layer 140 than in the dielectric layer 120, thereby achieving an efficient data program/erase operation.

A width of the channel region 155 is increased by the recess 119 to reduce short channel effect to a minimum. Since the source electrode 152 and the drain electrode 157 are spaced apart from the substrate 100, parasitic capacitance can be reduced. Thus, parasitic delay and power consumption can be reduced.

FIG. 2 is a perspective view illustrating a non-volatile memory device according to further embodiments of the present invention. The non-volatile memory device illustrated in FIG. 2 includes multiple of the non-volatile memory devices of FIG. 1 stacked in three dimensions.

Referring to FIG. 2, a first insulating layer 205 is disposed on a first substrate 200. The first insulating layer 205 may comprise an insulation layer such as, for example, a silicon oxide layer, a silicon nitride layer or a silicon oxynitride layer. A plurality of first word lines 210 may be disposed on the first insulating layer. The first word lines 210 may extend in a first direction such as, for example, the x-direction of FIG. 2. A second insulating layer 215 is disposed on the first insulating layer 205 to cover sidewalls of the first word lines 210.

A plurality of first active regions 250 may cross over the first word lines 210. The first active regions 250 may extend in a second direction that crosses the first direction such as, for example, the y-direction of FIG. 2. A first charge trap layer 230 is disposed between the first active regions 250 and the first word lines 210. The first charge trap layer 230 may have a charge trap site capable of trapping a charge.

Each of the first word lines 210 may have first recesses 219 at portions of the first word lines that intersect the first active regions 250. The first active regions 250 may be disposed in the first recesses 219. The first recesses 219 may each have a curved surface such as, for example, a reverse-arch shape. The first active regions 250 may have bottom surfaces that have an arch shape. The first recesses 219 extend through the second insulating layer (which is on the sidewalls of each of the first word lines 210), and the first active regions 250 extend in the second direction along the first recesses 219.

A plurality of first dielectric layers 220 are provided, each of which is between a respective one of the first charge trap layers 230 and the first word lines 210. A plurality of first tunnel insulating layers 240 are likewise provided. Each of the first tunnel insulating layers is disposed between a respective one of the first charge trap layers 230 and a respective one of the first active regions 250. If the first tunnel insulating layers 240, the first charge trap layers 230 and the first dielectric layers 220 form an oxide-nitride-oxide structure, the non-volatile memory device may be a SONOS device.

The first active regions 250 may each be part of a respective one of a plurality of first memory cells. The word line 210 that crosses under each of the first active regions 250 may act as a control gate of the first memory cell that each first active region 250 is part of.

The first active regions 250 may each be formed of polysilicon. As discussed above with respect to FIG. 1, each of the first active regions 250 may include a channel region, a source electrode and a drain electrode. A radius of curvature of each of the first tunnel insulating layers 240 may be shorter than a radius of curvature of the first dielectric layer 220 that is adjacent each first tunnel insulating layer 240. Since an electric field will be formed more strongly in each first tunnel insulating layer 240 than in its adjacent first dielectric layer 220, data program/erase operation may be performed efficiently. A width of each of the channel regions 255 may be increased by the first recesses 219 to reduce short channel effect.

An interlayer dielectric layer 260 is stacked on the first active regions 250. The interlayer dielectric layer 260 may comprise one or more insulation layers such as, for example, a silicon oxide layer, a silicon nitride layer or a silicon oxynitride layer. A second substrate 300 is stacked on the interlayer dielectric layer 260, and a third insulating layer 305 is disposed on the second substrate 300. The third insulating layer 305 may comprise an insulating material such as, for example, a silicon oxide layer, a silicon nitride layer or a silicon oxynitride layer.

A plurality of second word lines 310 may be disposed on the third insulating layer. The second word lines 310 may extend in the first direction (i.e. the x-direction of FIG. 2). A forth insulating layer 315 is disposed on the third insulating layer 305 to cover sidewalls of the second word lines 310.

A plurality of second active regions 350 may cross over the second word lines 310. The second active regions 350 may extend in the second direction (i.e., the y-direction of FIG. 2). A plurality of second charge trap layers 330 are provided, with each of the second charge trap layers 330 disposed between a respective one of the second active regions 350 and the second word lines 310. Each second charge trap layer 330 may have a charge trap site capable of trapping a charge.

Each of the second word lines 310 may have second recesses 319 at portions of the second word lines 310 that intersect the second active regions 350. The second active regions 350 may be disposed in the second recesses 319. The second recesses 319 may have a curved surface such as, for example, a surface having a reverse-arch shape. The second active regions 350 may have bottom surface that has, for example an arch shape. The second recesses 319 may extend through the forth insulating layer 315. Thus, the second active regions 350 may extend in the second direction along the second recesses 319 through the second word lines 310 and the fourth insulating layer 315.

A second dielectric layer 320 is disposed between each second charge trap layer 330 and the second word lines 310. A second tunnel insulating layer 340 is disposed between each second charge trap layer 330 and its corresponding second active region 350. If the second tunnel insulating layer, the second charge trap layer 330 and the second dielectric layer 320 form an oxide-nitride-oxide structure, the non-volatile memory device may be a SONOS device.

The second active regions 350 may each be part of a respective one of a plurality of second memory cells. The word line 310 that crosses under each of the second active regions 350 may act as a control gate of the second memory cell that each second active region 350 is part of.

The second active regions 350 may be formed of polysilicon. Each of the second active regions 350 may include channel regions, source electrodes and drain electrodes. A radius of curvature of the second tunnel insulating layer 340 may be shorter than a radius of curvature of the second dielectric layer 320. Since an electric field is formed more strongly in the second tunnel insulating layer 340 than in the second dielectric layer 320, data program/erase operation may be performed efficiently. A width of the channel region 355 is increased by the second recesses 319 to reduce short channel effect. The source and drain electrodes of the first and second active regions 250 and 350 are spaced apart from the first substrate 200 and second substrate 300, and thereby parasitic capacitance can be reduced to reduce parasitic delay and power consumption.

According to certain embodiments of the present invention, the non-volatile memory device may include an active region having a bottom surface that has an arch shape, and may include memory cells that are stacked in three dimensions.

In further embodiments, the first word lines 210 may extend in the first direction, and the second word lines 310 may extend in the second direction. In such embodiments, the first active regions 250 extend in the second direction and the second active regions 350 extend in the first direction.

Figure 3A:
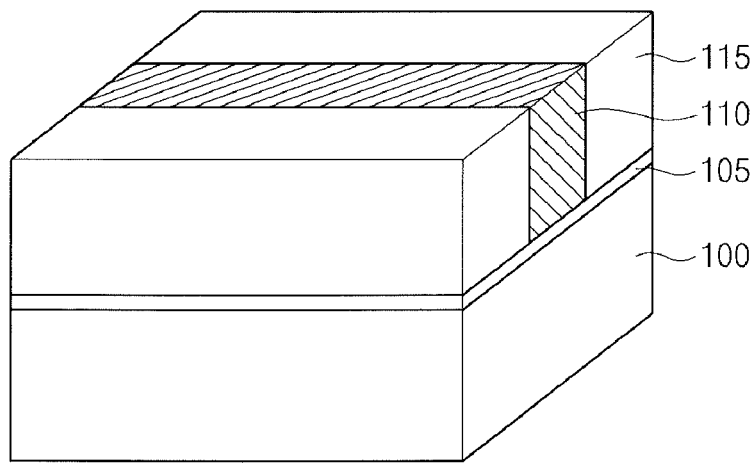
FIGS. 3A through 3E are perspective views illustrating a method of forming a non-volatile memory device according to an embodiment of the present invention.

FIGS. 3A through 3E are perspective views illustrating a method of forming a non-volatile memory device according to embodiments of the present invention;

Referring to FIG. 3A, a first insulating layer 105 is formed on a substrate 100. The first insulating layer 105 may comprise, for example, a silicon oxide layer, a silicon oxynitride layer or a silicon nitride layer. A word line 110 is formed on the first insulating layer 105. The word line 110 may extend in a first direction such as, for example, the x-direction of FIG. 1. A second insulating layer 115 is formed on the first insulating layer 105 to cover sidewalls of the word line 110.

The word line 110 may comprise a conductive layer that is formed in a trench in the second insulating layer 115. In some embodiments, the second insulating layer 115 may be formed first, then a trench may be formed in the second insulating layer 115, and then the word line 110 may be formed in the trench and partially removed to expose the upper surface of the second insulating layer 115.

In other embodiments, a conductive layer may first be formed on the first insulating layer 105, and the conductive layer is patterned into the word line 110. Then, the second insulating layer 115 is formed to cover the first and second sidewalls of the word line 110.

The word line 110 may be formed using a SOI (Semiconductor On Insulator) substrate. The SOI substrate may include a semiconductor substrate, a buried insulating layer on the semiconductor substrate, and a silicon layer on the buried insulating layer. The silicon layer of the SOI substrate may be patterned to be a word line. In this case, the word line 110 may be formed of mono-crystalline silicon.

Figure 3B:
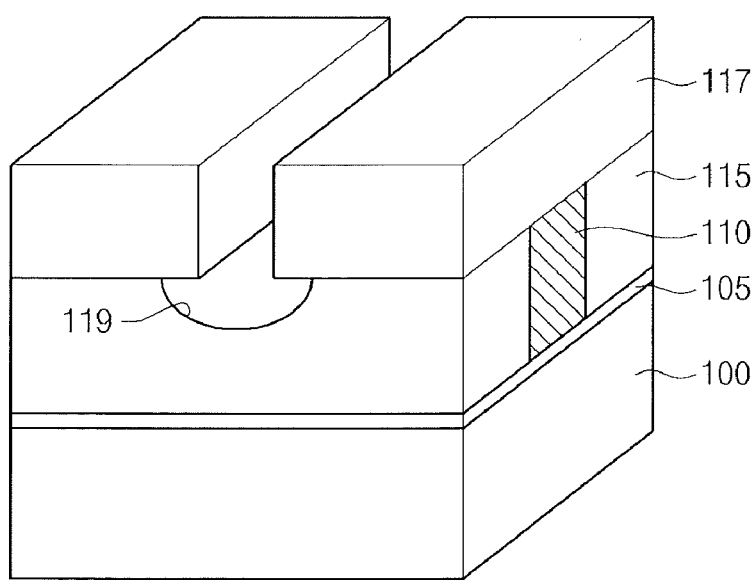

Referring to FIG. 3B, a mask pattern 117 is formed on the word line 110 and the second insulating layer 115. The mask pattern 117 may be formed of material having an etch selectivity with respect to the word line 110 and the second insulating layer 115. As known to those of skill in the art, a material 'b' that has etch selectivity with respect to a material 'a' means that material 'b' may undergo minimal etching when material 'a' is heavily etched. Thus, during heavy etching of the word line 110 and the second insulating layer 115, the mask pattern 117 will only be minimally etched.

The word line 110 and the second insulating layer 115 are etched using the mask pattern 117 as a etch mask to form a recess 119 in the word line 110 and in the second insulating layer 115. The recess 119 may be formed to extend in a second direction that intersects the first direction. For example, the recess 119 may extend in the y-direction of FIG. 1. The etching process may be, for example, a wet etching process or a chemical dry etching process. If the etching process is an isotropic etching process, the recess 119 may have a profile of a reverse arch shape.

Figure 3C:
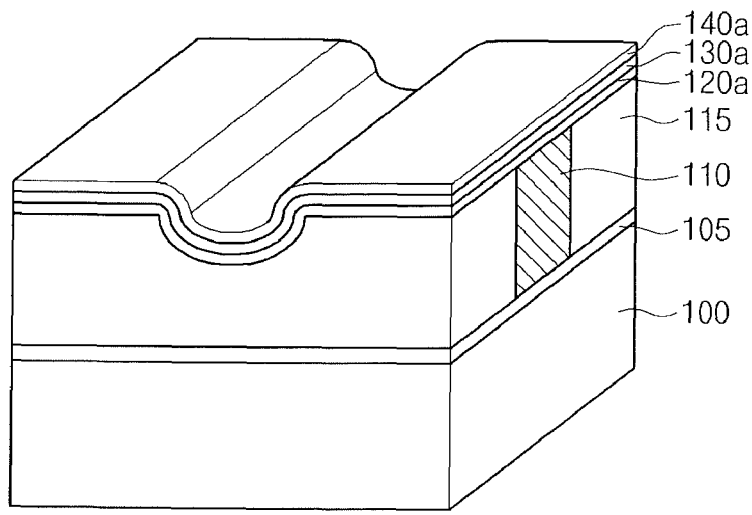

Referring FIG. 3C, the mask pattern 117 is removed, and a preliminary dielectric layer 120a, a preliminary charge trap layer 130a and a preliminary tunnel insulating layer 140a are formed on the second insulating layer 115 and the word line 110. The preliminary dielectric layer 120a, the preliminary charge trap layer 130a and the preliminary tunnel insulating layer 140a may each be formed, for example, through a CVD (Chemical Vapor Deposition) method. The preliminary dielectric layer 120a may include at least one of silicon oxide, aluminum oxide, lanthanum hafnium oxide, lanthanum aluminum oxide and dysprosium scandium oxide. The preliminary charge trap layer 130a may be formed of material with a charge trap site such as, for example, silicon nitride. The preliminary tunnel insulating layer 140a may be formed of at least one of silicon oxide, silicon oxynitride, hafnium oxide and the like.

Figure 3D:
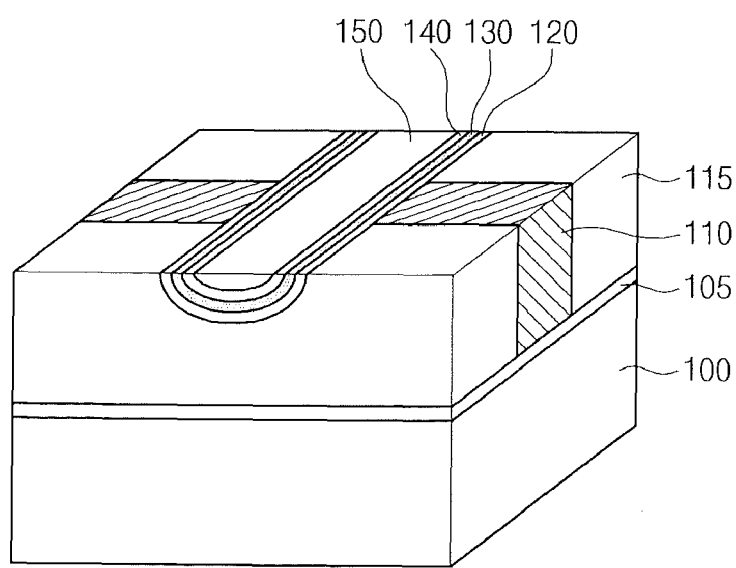

Referring FIG. 3D, an active region 150 is formed on the preliminary tunnel insulating layer 140a in the recess 119. The active region 150 (along with the preliminary dielectric layer 120a, the preliminary charge trap layer 130a and the preliminary tunnel insulating layer 140a) may fill the recess 119. The active layer 150 may be formed, for example, by depositing a polysilicon layer on the preliminary tunnel insulating layer 140a, and by then performing a chemical mechanical polishing (CMP) process on the polysilicon layer to expose the second insulating layer 115. Via this chemical mechanical polishing process, portions of the preliminary dielectric layer 120a, the preliminary charge trap layer 130a and the preliminary tunnel insulating layer 140a that are outside of the recess 119 may be removed, thereby forming a dielectric layer 120, a charge trap layer 130 and a tunnel insulating layer 140. The dielectric layer 120, the charge trap layer 130 and the tunnel insulating layer 140 may have a curved surface such as, for example, an arch shape along the profile of the recess 119.

Figure 3E:
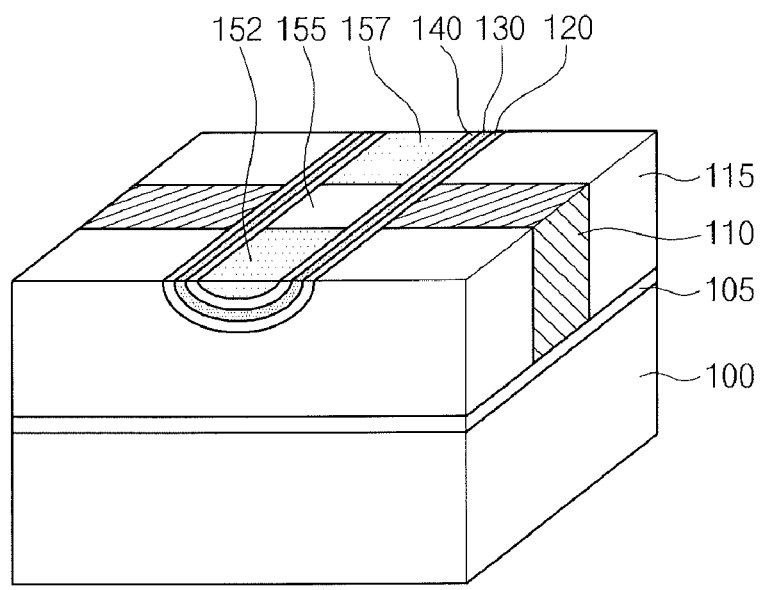

Referring FIG. 3E, an ion implantation mask (not shown) is formed on the active region 150 and an ion implantation process is performed to form a source electrode 152 and a drain electrode 157. The source electrode 152 and the drain electrode 157 may be formed while the ion implantation mask covers the word line 110. Therefore, a channel region 155 may be formed between the source electrode 152 and the drain electrode 157. The channel region 155 may have different dopants than the source electrode 153 and the drain electrode 157.

A radius of curvature of the tunnel insulating layer 140 may be shorter than a radius of curvature of the dielectric layer 120. Since an electric field is formed more strongly in the tunneling insulating layer 140 than in the dielectric layer 120, data program/erase operation may be performed efficiently. A width of the channel region 155 may be increased by the recess 119 to reduce short channel effect.

The non-volatile memory device according to embodiments of the present invention can be produced on various semiconductor package types including, for example, a PoP (Package on Package), a BGAs (Ball grid arrays), a CSPs (Chip Scale Packages), a PLCC (Plastic Leaded Chip Carrier), a PDIP (Plastic Dual In-Line Package), a Die in Waffle Pack, a Die in Wafer Form, a COB (Chip On Board), a CERDIP (Ceramic Dual In-Line Package), a MQFP (Plastic Metric Quad Flat Pack), a TQFP (Thin Quad Flat Pack), a SOIC (Small Outline), a SSOP (Shrink Small Outline Package), a TSOP (Thin Small Outline Package), a SIP (Small In Package), a MCP (Multi Chip Package), a WFP (Wafer-level Fabricated Package), a WSP (Wafer-level Processed Stack Package) and so on. A package with the non-volatile memory device according to embodiments of the present invention may incorporate a controller and/or a logic circuit.

Figure 4:
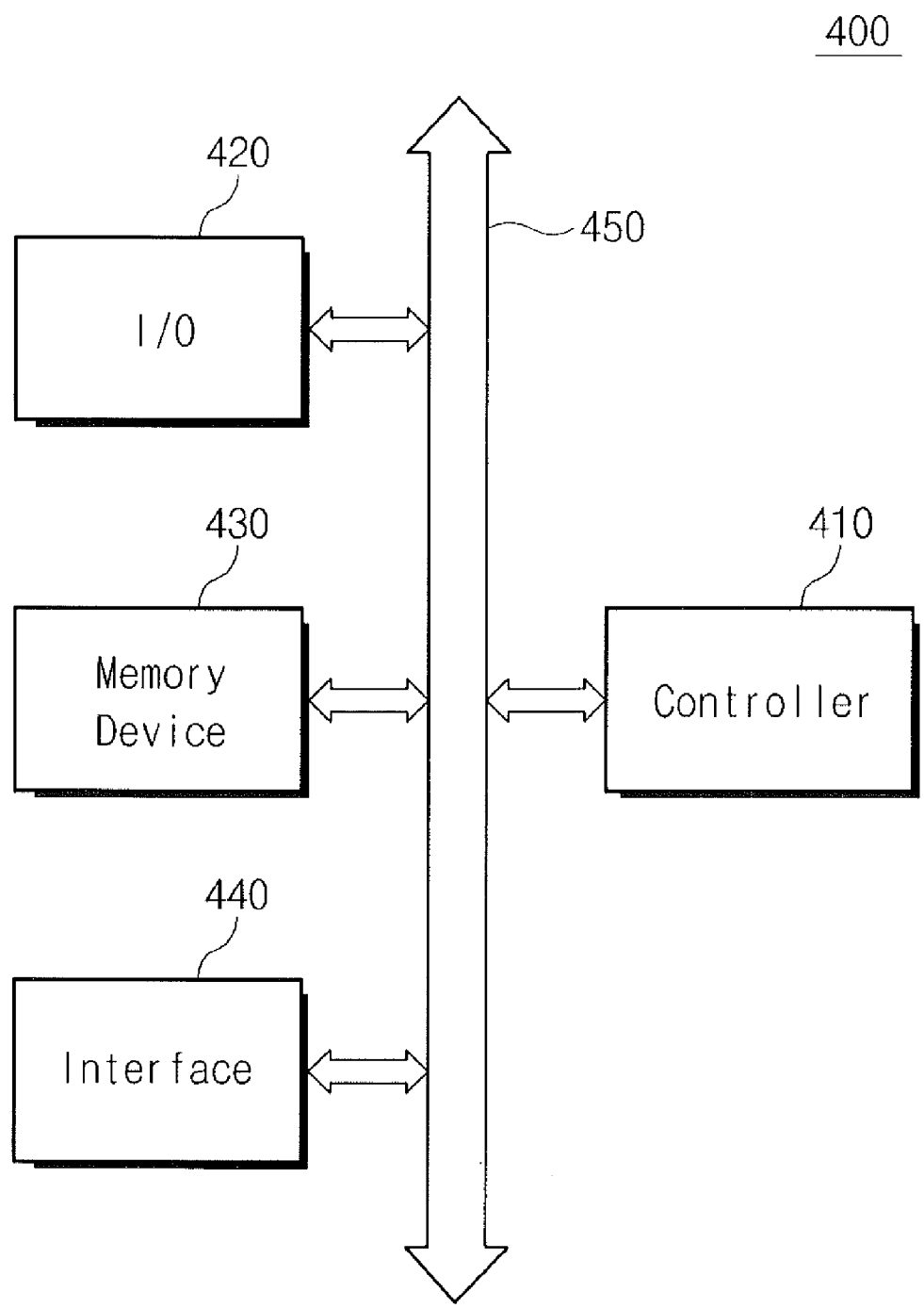
FIG. 4 is a block diagram illustrating an electronic system including a non-volatile memory device according to embodiments of the present invention.

FIG. 4 is block diagram illustrating an electronic system including a non-volatile memory device according to embodiments of the present invention.

Referring to FIG. 4, an electric system 400 may include a controller 410, a Input/Output (I/O) device 420, a memory device 430, an interface 440 and a bus 450. The controller 410, the I/O device 420, the memory device 430 and/or the interface 440 may be connected by the bus 450. The bus 450 may be any path through which data is transmitted.

The controller 410 may include at least one of a microprocessor, a digital signal processor, a micro controller and a logic device. The I/O device 420 may include at least one of a keypad, a keyboard and a display device. The memory device 430 may store data and/or commands. The memory device 430 may include one of the non-volatile memory devices according to embodiments of the present invention. The memory device 430 may further include another type memory device (for example, a phase changeable memory device, a MRAM, a DRAM and/or a SRAM device). The interface 440 may take functions that transmit data to a communication network and receive data from a communication network. The interface 440 may be a wired interface or a wireless interface. For example, the interface 440 may include an antenna or a wire/wireless transceiver. The electric system 400 may include a high speed DRAM and/or SRAM as an operation memory to enhance the controller's performance.

The electric system 400 can be applied to a Personal Digital Assistant (PDA), a portable computer, a web tablet, a wireless phone, a mobile phone, a digital music player, a memory card or any other electric product that is capable of transmitting and/or receiving data in a wired or wireless environment.

Figure 5:
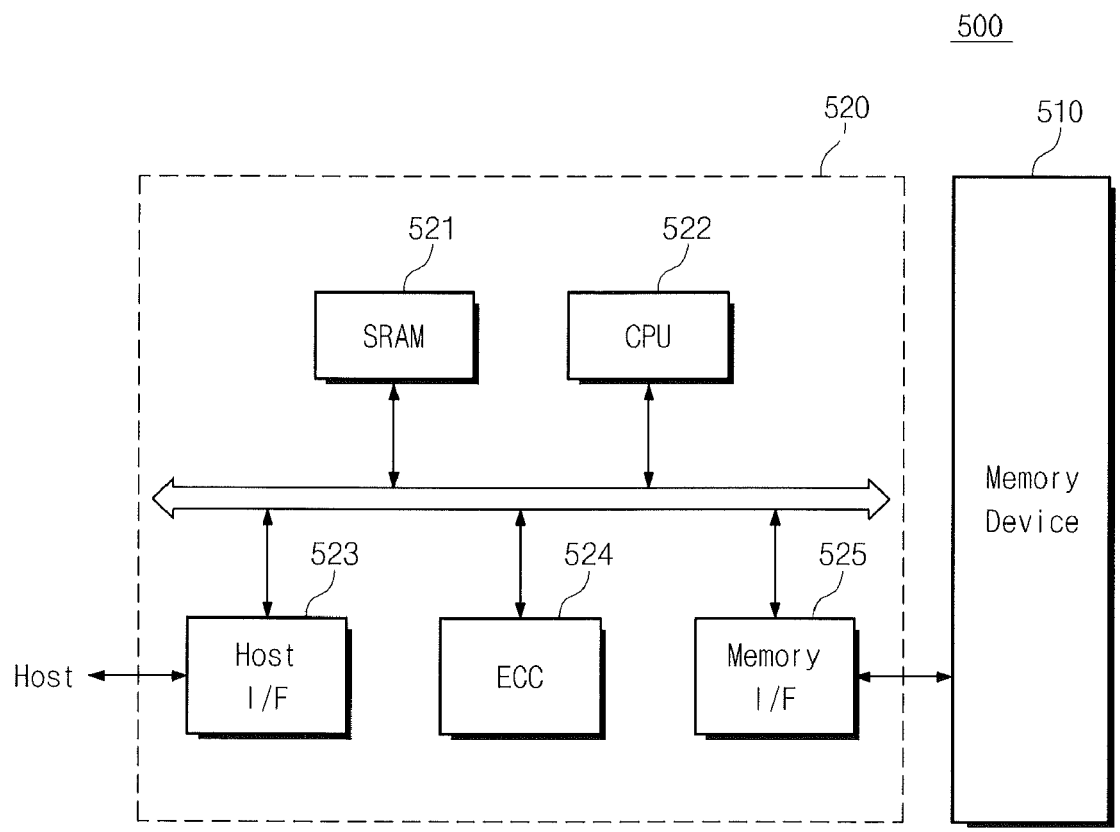
FIG. 5 is a block diagram illustrating a memory card including a non-volatile memory device according to embodiments of the present invention.

FIG. 5 is block diagram illustrating a memory card including a non-volatile memory device according to embodiments of the present invention.

Referring to FIG. 5, a memory card according to an embodiment of the present invention includes a memory device 510. The memory device 510 may include at least one of the non-volatile memory devices according to embodiments of the present invention. The memory device 510 may further include another type of semiconductor memory device such as, for example, a PRAM, a MRAM, a DRAM and/or a SRAM. The memory card 500 may include a memory controller 520 that manages communication between a host and the memory device 510.

The memory controller 520 may include a central processing unit 522 that controls the general operation of the memory card 500, and a SRAM 521 that may serve as an operational memory of the processing unit 522. The memory controller 520 may further include a host interface 523 and memory interface 525. The host interface 523 may include protocols for communicating data between the memory card 500 and the host. The memory interface 525 may connect the memory controller 520 and the memory device 510.

Further, the memory controller 520 may include an ECC (Error Collection Code) block 524. The ECC block may be capable of detecting and correcting errors in data read from the memory device 510. The memory card 500 may include a ROM device storing code data by which the memory card 500 interfaces with the Host. The memory card 500 may be used for a portable data storage card. Alternatively, the memory card 500 may be used for a Solid State Disk (SSD) that is used to replace a hard disk in a computer system.

According to the embodiments of the present invention, a radius of curvature of the tunnel insulating layer may be shorter than a radius of curvature of the dielectric layer. Accordingly, an electric field is formed more strongly in the second tunnel insulating layer than in the second dielectric layer to achieve an efficient data program/erase operation. A width of the channel region may be increased by the second recesses to reduce short channel effect. The source and drain electrodes of the first and second active regions may be spaced apart from the first substrate and the second substrate. Accordingly, parasitic capacitance can be reduced to reduce parasitic delay and power consumption.

The above-disclosed subject matter is to be considered illustrative and not restrictive, and the appended claims are intended to cover all such modifications, enhancements, and other embodiments, which fall within the true spirit and scope of the inventive concept. Thus, to the maximum extent allowed by law, the scope of the inventive concept is to be determined by the broadest permissible interpretation of the following claims and their equivalents, and shall not be restricted or limited by the foregoing detailed description.

What is claimed is:

1. A non-volatile memory device comprising:
a word line disposed on a substrate;
an active region that crosses over the word line; and
a charge trap layer that is between the word line and the active region,
wherein the word line includes a recess and the active region is entirely within the recess.

2. The device of claim 1, wherein the recess has a reverse-arch shape.

3. The device of claim 1, wherein the word line comprises a mono-crystalline silicon layer, and the active region comprises a polysilicon layer.

4. The device of claim 1, wherein the word line comprises a polysilicon layer and/or a metal layer, and the active region comprises a polysilicon layer.

5. The device of claim 1, wherein the active region is part of a first memory cell, and wherein the word line is configured to act as a control gate of the first memory cell.

6. The device of claim 1, wherein the word line is between the substrate and the active region.

7. The device of claim 3, wherein the substrate comprises a semiconductor substrate and a buried insulating layer on the semiconductor substrate, and the word line is disposed on the buried insulating layer, and the semiconductor substrate, the buried insulating layer and the word line constitute an SOI substrate.

8. A non-volatile memory device comprising:
a word line disposed on a substrate;
an active region that crosses over the word line; and
a charge trap layer that is between the word line and the active region; and
an insulating layer on sidewalls of the word line,
wherein the word line includes a recess that has a reverse-arch shape,
wherein the active region is at least partly within the recess, and
wherein the recess extends through at least a portion of the insulating layer, and
wherein a bottom surface of the active region has an arch shape.

9. The device of claim 8, wherein the active region includes a source electrode, a drain electrode and a channel region, and wherein the source electrode is formed in a portion of the recess that is on a portion of the insulating layer that is on a first of the sidewalls of the word line, and the drain electrode is formed in a portion of the recess that is on a portion of the insulating layer that is on a second of the sidewalls of the word line.

10. The device of claim 9, wherein the source electrode and the drain electrode are each spaced apart from the substrate.

11. A non-volatile memory device comprising:
a word line disposed on a substrate;
an active region that crosses over the word line; and
a charge trap layer that is between the word line and the active region; and
a dielectric layer between the charge trap layer and the word line; and
a tunnel insulating layer between the charge trap layer and the active region,
wherein the word line includes a recess that has a reverse-arch shape,
wherein the active region is at least partly within the recess, and
wherein the dielectric layer, the charge trap layer and the tunnel insulating layer have curved surfaces along the recess.

12. The device of claim 11, wherein the tunnel insulating layer comprises a silicon oxide layer, the charge trap layer comprises a silicon nitride layer, and the dielectric layer comprises a silicon oxide layer.

13. The device of claim 11, wherein a radius of curvature of the tunnel insulating layer is shorter than a radius of curvature of the dielectric layer.

* * * * *